United States Patent [19]

Edwards

[11] Patent Number: 5,155,724
[45] Date of Patent: Oct. 13, 1992

[54] DUAL MODE DIPLEXER/MULTIPLEXER

[75] Inventor: Richard C. Edwards, Cedar Rapids, Iowa

[73] Assignee: Rockwell International Corporation, Seal Beach, Calif.

[21] Appl. No.: 589,310

[22] Filed: Sep. 26, 1990

[51] Int. Cl.⁵ .......................... H04B 1/18; H04B 1/48
[52] U.S. Cl. ...................................................... 370/37
[58] Field of Search ............................ 370/37, 36, 112

[56] References Cited

U.S. PATENT DOCUMENTS 4,240,155 12/1980 Vaughan ............................ 370/37

OTHER PUBLICATIONS

Hoffman, M. "Microwave Diplexer", Electrical Communication, vol. 45, No. 4, pp. 358–362, 1970.

Primary Examiner—Douglas W. Olms
Assistant Examiner—Wellington Chin
Attorney, Agent, or Firm—John J. Horn; M. Lee Murrah; H. Fredrick Hamann

[57] ABSTRACT

A broadband diplexer for use in dividing input signals in accordance with frequency and in constructing multiplexers including multiple diplexers. The diplexer includes a pair of 0-degree couplers one of which is configured as a signal splitter while the other is configured as a signal combiner. A pair of filters having identical frequency selection characteristics but opposite impedance and admittance characteristics are connected in between the splitter and the output port of the combiner. In operation, input signals are received at the input port to the splitter and output signals are provided at the isolation port of the splitter and the output port of the combiner. The couplers and filters act in combination to divide the input signals in accordance with frequency so that the output signals have complementary spectra. The use of 0-degree couplers allows for very broadband performance by the diplexer.

11 Claims, 4 Drawing Sheets

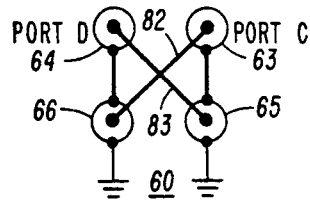
FIG. 4A
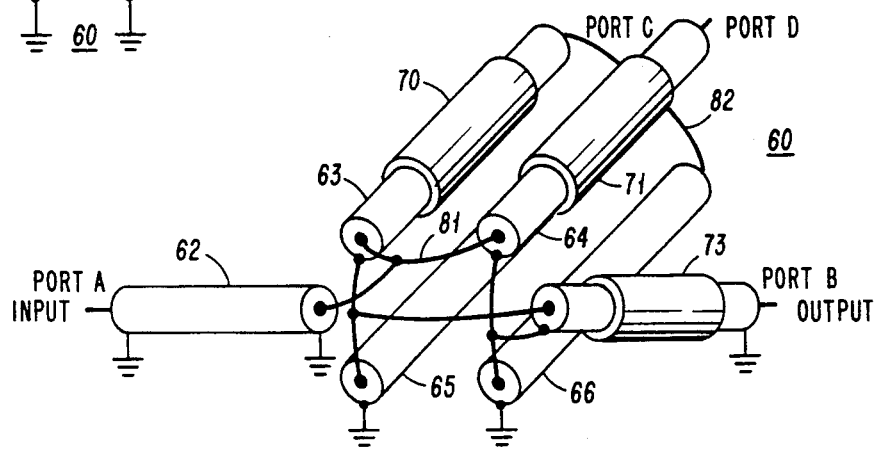
FIG. 4B
FIG. 5
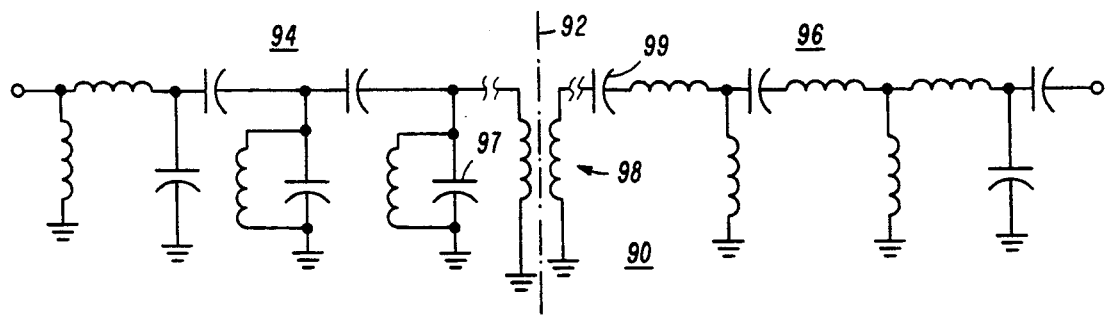
FIG. 6
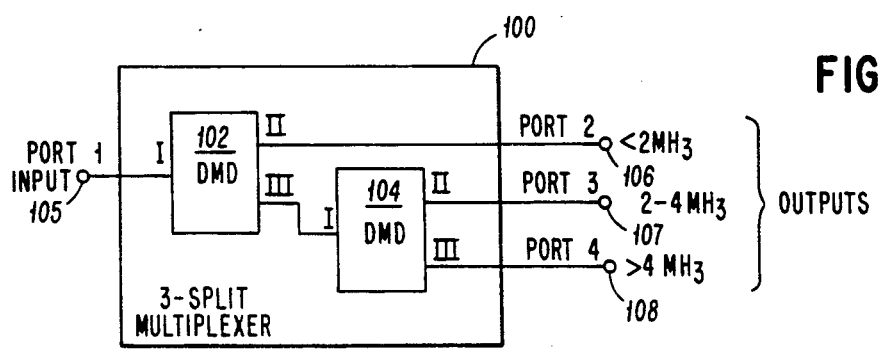

DUAL MODE DIPLEXER/MULTIPLEXER

BACKGROUND OF THE INVENTION

The present invention relates to frequency selective electrical filters and more particularly to diplexers for splitting an input signal into spectrum components having complimentary frequency spectra and to multiplexers comprising multiple interconnected diplexers.

Diplexers comprising filters connected between first and second quadrature hybrid couplers configured as a splitter and a combiner have been commonly employed to accomplish the functions of combining and/or separating of signals having different frequencies. Such conventional hybrid-filter diplexers employ substantially identical filters to divide the bandwidth of the diplexer into two frequency bands such that input signals having frequencies within one band are reflected back by the filters into the first hybrid while input signals having frequencies is within the other band are passed by the filters to the second hybrid. Input signals are thereby divided between a port of the first hybrid serving as a first diplexer output port and a port of the second hybrid serving as a second diplexer output port in accordance with frequency.

However, such hybrid-filter diplexers suffer from a serious limitation in that the bandwidth of the diplexer is limited to the bandwidth of the quadrature hybrids which are inherently narrowband and cannot provide acceptable equal power division of input signals between hybrid terminals over much more than a single octave in frequency range. Unfortunately, quadrature hybrids are key components of diplexers for which substitutes having improved broadband performance are not readily available and, consequently, the narrowband performance of diplexers has proved to be an intractable problem.

It is an object of the present invention to provide a new type of diplexer which is broadband providing acceptable performance over an extended frequency range approaching a full decade in breadth.

It is another object of the present invention to provide a broadband diplexer utilizing readily available and reasonable cost components and in the interests of simplicity and economy employing identical filters coupled between its splitter and combiner components.

It is a further object of the present invention to provide a diplexer having infinite isolation between its input and output ports and having consistent and equal impedance between its input and output ports over the entire frequency spectrum (providing all ports are appropriately terminated in matching impedances) which allows for the cascading of diplexers in an multiplexer networks.

SUMMARY

The present invention comprises a "dual mode" diplexer having an input port for receiving input signals and two output ports for providing output signals having primary and complimentary spectra. The diplexer includes a pair of 0-degree couplers one of which is a configured as signal splitter while the other is configured as a signal combiner. A pair of filters which are "duals" of each other having identical frequency selection characteristics but opposite impedance and admittance characteristics are connected in between the splitter and combiner.

In operation, input signals are received by the splitter and divided into equal and in-phase components supplied to the filters. Signals within the matching passbands of the filters are passed on to the combiner while signals within the matching stopbands of the filters are reflected back to the splitter. Signals passed to the combiner are split between the output and isolation ports of the combiner; however, these signals are 180° out-of-phase at the combiner isolation port and thereby cancel while they are in-phase at the combiner output port and therefore add to provide the primary spectra output of the diplexer. The signals reflected by the filters are split between the input and isolation ports of the splitter; however, these signals are 180° out-of-phase at the splitter input port and thereby cancel while they are in-phase at the isolation port and therefore add to provide the complimentary spectra output of the diplexer. Diplexers constructed in accordance with the present invention may be interconnected and used to form multiplexer networks for dividing input signals into multiple frequency selective components.

In the preferred embodiment of the present invention, the splitter and combiner of the diplexer are realized as T-bridge directional transmission line couplers having infinite bandwidth and providing excellent high-frequency performance. Further, the dual filters are also constructed also as antimetric filters whereby the same filter maybe used for both filter elements in each diplexer by simply reversing the input and output connections of the filter.

BRIEF DESCRIPTION OF THE DRAWINGS

FIGS. 4A and 4B provide a perspective view and back view, respectively, of a physical realization of a 0-degree transmission line coupler which may be configured for use as either the splitter or combiner in the diplexer of the present invention.

FIG. 5 provides a schematic of an exemplary antimetric filter illustrating the construction and center line antisymmetry of such filters.

FIG. 6 provides a block diagram of a three-split multiplexer constructed using dual mode diplexers of the present invention.

DESCRIPTION OF THE PREFERRED EMBODIMENT

Figure 1:
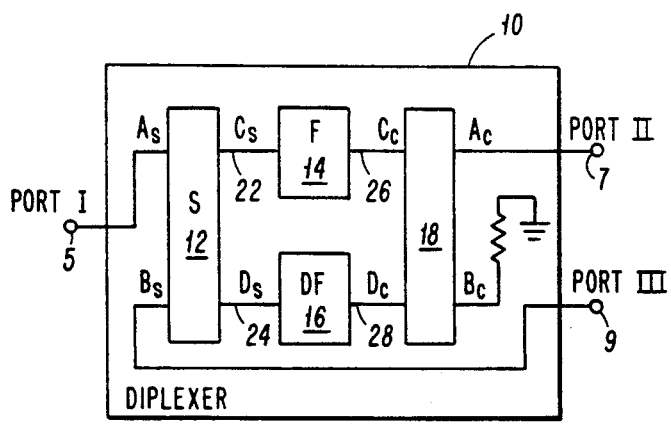
FIG. 1 provides a block diagram of a diplexer in accordance with one principles of the present invention.

Referring now to FIG. 1, the diplexer 10 comprises a three port device which splits the frequency spectrum of an input signal applied at input port I into a pair of complementary spectra at the output ports II and III. The diplexer 10 comprises a 0-degree splitter 12, a pair of filters 14 and 16 a 0-degree combiner 18. The filters 14 and 16 constitute "duals" of one another which have the same frequency selectivity but which are characterized by driving point reflection coefficients which are 180° out-of-phase. The normalized admittance of the filter 14 is equal to the normalized impedance of the filter 16 and vice versa. The filters 14 and 16 are coupled between the splitter 12 and the combiner 18 by having their input terminals 22 and 24 connected to the output ports $C_s$ and $D_s$ of the splitter 12 and their output terminals 26 and 28 connected to the input ports $C_c$ and $D_c$ of the combiner 18. A resistor 20 is connected between the isolation port $B_c$ of the combiner 18 and ground and serves as a dummy load. The input port $A_s$ to the splitter 12 serves as input port I to the diplexer 10. The output port $A_c$ of the combiner 18 serves as output port II from the diplexer 10 providing a primary spectrum output corresponding to the passbands of the filters 14 and 16. Splitter isolation port $B_s$ serves as output port III from the diplexer 10 providing a complementary spectrum output corresponding to the stopbands of the filters 14 and 16.

In operation, input signals to the diplexer 10 which are applied to port I (splitter port $A_s$) are split into equal voltage and in-phase components which are directed by way of the splitter ports $C_s$ and $D_s$ to the filters 14 and 16. Input signal energy at frequencies within the passband of the filters 14 and 16 is passed through these filters to the combiner 18 while input signal energy within the stopband of the filters 14 and 16 is returned to the splitter 12. More specifically, the voltage waves of the signals that are supplied to the filters 14 and 16 are reflected back through the splitter 12 with the reflected waves each being equally split between the splitter ports $A_s$ and $B_s$. However, because the wave reflected by the filter 16 is phase shifted by 180° with respect to the wave component reflected by the filter 14 in accordance with the differing reflection coefficients of these filters and because the wave component reflected by the filter 14 and transferred between port $C_s$ and port $B_s$ has its phase shifted by 180° in accordance with the operational characteristics of the splitter 12, the reflected wave components cancel at port $A_s$ since they are 180° out-of-phase and, conversely, add at port $B_s$ since they are in-phase with each other. Splitter port $B_s$ thereby provides the complimentary spectrum output for diplexer port III.

The voltage waves of the signals passed by the filters 14 and 16 and presented to the ports $C_c$ and $D_c$ of the combiner 18 are each split into equal voltage components which are directed to the combiner ports $A_c$ and $B_c$. However, because the wave component transferred between port $C_c$ and port $B_c$ is shifted in phase by 180° in accordance with the operational characteristics of the combiner 18, the wave components received at the port $B_c$ cancel since they are 180° out-of-phase and, conversely, the wave components received at the port $A_c$ add since they are in-phase. Combiner port $A_c$ thereby serves as output port II from the diplexer 10 providing a primary spectrum output corresponding to the passbands of the filters 14 and 16. Under normal conditions the resistor 20 should not dissipate any significant amounts of power.

It should be noted that the transfer frequency response of the diplexer 10 between port I and port II is identical to the matching frequency responses of the filters 14 and 16. The transfer response between port I and port III of the diplexer 10 is the complementary response of the filters 14 and 16 (i.e., all power that is not transferred to port II is transferred to port III). For example, if the filters 14 and 16 are lowpass then the primary response from port II will be lowpass while the complimentary response from port III will be highpass. Further, ports II and III are characterized by infinite isolation provided the input impedance to the diplexer 10 is matched to the resistor 20. Additionally, the input impedance at any port with the remaining ports terminated in an impedance matching the resistor 20 should be equal to the impedance of the resistor 20 over the entire frequency spectrum. This constant impedance property allows the cascading of diplexers such as the diplexer 10 in configurations of multiple interconnected diplexers operative as multiplexers.

Figure 2:
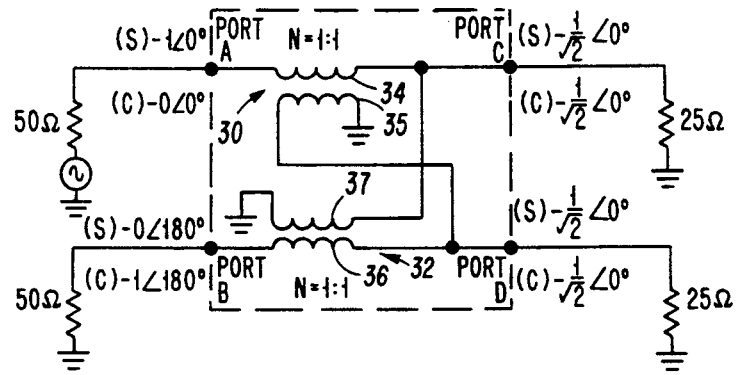
FIG. 2 provides a schematic of a directional coupler which may be configured for use as either a splitter or combiner within the diplexer of the present invention.

Referring now to FIG. 2, a conventional 0-degree 3 dB coupler 15 which may function as either the splitter 12 or combiner 18 depending upon its configuration is shown as including four ports A,B,C and D between which two transformers 30 and 32 are connected. The primary 34 of the transformer 30 is connected between ports A and C while the primary 36 of the transformer 32 is connected between ports B and D. The secondary 35 of the transformer 30 is connected to the port D while the secondary 37 of the transformer 32 is connected to the port C. This arrangement allows for the voltage wave of an input signal received at the port A to be split into equal and in-phase components supplied at the ports C and D and for the voltage wave of a signal received at port D to be split into equal and in-phase components at the ports A and B. On the other hand, the voltage wave of an input signal received at the port C is split into equal but 180° out-of-phase components supplied at the ports A and B.

Figure 3A:
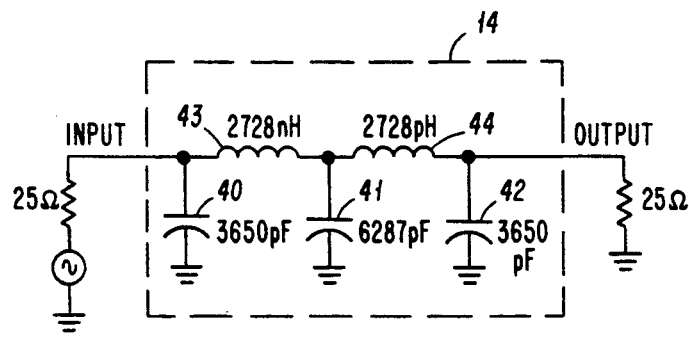
FIGS. 3A and 3B provide schematics of filters which comprise duals of each other and could be used as filters in the diplexer of the present invention.
Figure 3B:
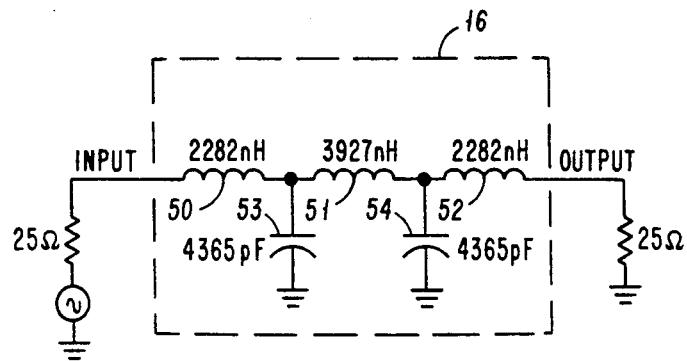

Referring now to FIGS. 3A and 3B, a pair of exemplary filters are shown of the type which could be utilized as filters 14 and 16 in the diplexer 10. Filters 14 and 16 are ladder networks which are duals of one another such that the normalized impedance of one of these filters is equal to the normalized admittance of the other. The filter 14 comprises the parallel capacitors 40, 41 and 42 and the series inductors 43 and 44. The filter 16 comprises the parallel capacitors 53 and 54 and the series inductors 50, 51 and 52. The filters both comprise 5-pole Chebyshev 0.1 db ripple filters having 2 MHz cutoffs given the values of the capacitors and inductors shown in the Figures.

Any filter in a ladder arrangement such as the filters of FIGS. 3A and 3B can be changed into its dual in accordance with the following steps:

1. Change all inductors to capacitors and vice versa without changing the normalized element values.

2. Change all normalized resistances into conductances and vice versa with the values unchanged.

3. Change all shunt branches to series branches and vice versa.

4. Change all elements in series with each other into elements that are in parallel with each other.

The dual filters 14 and 16 have the same frequency response, but their driving point reflection coefficient values are 180° out-of-phase over the entire frequency spectrum.

Referring now to FIG. 4, the transmission line directional coupler 60 may be used in place of the splitter 12 and combiner 18 shown in FIG. 1 in order to adapt the diplexer 10 for high frequency operations (i.e., up to 100 MHz) and provide couplers having theoretically infinite bandwidth. The coupler 60 includes 6 coaxial transmissions lines 60–67 having 50 ohm characteristic impedances and which are of arbitrary but equal length (preferably less than λ/2) and which are interconnected in a T-bridge configuration. When the coupler 60 is configured as a splitter and port A is used as an input port and ports C and D are used as output ports (with port B serving as an isolation port), the input signal provided to port A is supplied down transmission line 62 and is split at bridge 81 between the transmission lines 63 and 64 and output ports C and D. Signals reflected by the filter 14 connected to the port C are split at bridge 82 between the transmission lines 63 and 66 and supplied to ports A and B respectively, by way of lines 62 and 67. However, since the transmission line 66 is connected to the outer conductor of the transmission line 67, the signal provided to port B is 180° out-of-phase with the signal provided to port A. Signals reflected by the filter 16 connected to port D are split at bridge 83 between the transmission lines 64 and 65 and are supplied to A and B respectively, by way of lines 62 and 67. Since the transmission line 65 is connected to the center conductor of the transmission line 67, the signals provided to ports A and B are in-phase with each other (but 180° out-of-phase with the signal reflected over to port B by the filter 14). However, since the signals reflected by filter 16 are 180° out-of-phase with the signals reflected by filter 14, the signals reflected by the filters 14 and 16 into the ports C and D cancel at port A since they are 180° out-of-phase with each other and add at port B since they are in-phase with one another.

When the coupler 60 is used as a combiner and ports C and D are used as input ports and port A is used as an output port (with port B serving as an isolation port), the operation of the coupler is straight forward to visualize. The input signal provided to port C is split at the bridge 82 between the transmission lines 63 and 66 and provided to the ports A and B by way of the transmission lines 63 and 67. The input signal provided to port D is split at bridge 83 between the transmission lines 64 and 65 and provided to ports A and B by way of the transmission lines 62 and 67. However, since the transmission line 66 is connected to the outer conductor of the transmission line 67, the signal provided from port C to port B is 180° out-of-phase with the signal provided from port C to port A and also the signals provided from port D to ports A and B. Consequently, the signals presented to ports C and D add at port A since they are in-phase and cancel at port B since they are 180° out-of-phase. Key elements in the operation of the coupler 16 may be seen to be the bridge connections 81, 82 and 83 at which the signals are split into equal voltage components and the connection arrangement of the transmission lines 65 and 66 to the center and outer conductors of the transmission line 67 associated with port B. Ferrite sleeves 70, 71 and 73 are coupled onto the transmission lines 63, 64 and 67 in order to help suppress unwanted currents due to finite even-mode impedances from the center nodes of the bridge to ground which occur whenever the outer conductor of a coaxial line is grounded on one end but floats on its other end. It should be noted that the transmission lines 62, 63, 64, 65, 66 and 67 can also be realized with twin lead bifilar windings wound around suitable ferrite cores.

The design of the diplexer 10 of the present invention can be further simplified through the use of filters 14 and 16 that are not only duals of each other but are also "antimetric", that is they have mirror-image antisymmetry with respect to the center line of the filter. The same filter can then be used for both filter 14 and filter 16 by reversing the input and output connections to the filter device.

Referring now to FIG. 5, an exemplary Chebyshev narrowband antimetric filter 90 is shown which has the required mirror-image antisymmetry with respect to center line 92. The right and left halves 94 and 96 of the filter are physical duals of each other connected back to back. All even order Butterworth and Chebyshev filters are antimetric assuming the normal design constraint of zero mismatch loss offset in the passband. It should be noted that while the ideal transformer 98 seemingly presents a design problem, it may be conveniently absorbed along with adjacent capacitors 97 and 99 into a Norton transform in which only three capacitors are used.

Referring now to FIG. 6, dual mode diplexers 102 and 104 constructed in accordance with the present invention are configured for forming a 3-split multiplexer 100. The diplexer 102 is constructed using lowpass filters having corner frequencies at 2 MHz while the diplexer 104 is constructed using lowpass filters having corner frequencies at 4 MHz. The multiplexer 100 is arranged so that input to the multiplexer 100 is received at terminal 105 comprising port 1 of the multiplexer and corresponding to port I of the diplexer 102. Output from the multiplexer 100 is provided at terminals 106, 107 and 108 comprising ports 2, 3 and 4 of the multiplexer and corresponding to ports II of the diplexer 102, II of the diplexer 104 and III of the diplexer 104. The line 109 interconnects port III of the diplexer 102 to the port I of the diplexer 104. It should be noted that the ports I, II and III of the diplexers 102 and 104 represent the input ports, primary spectrum output ports and complimentary spectrum output ports of the diplexers, respectively, as previously explained with respect to FIG. 1.

Figure 7:
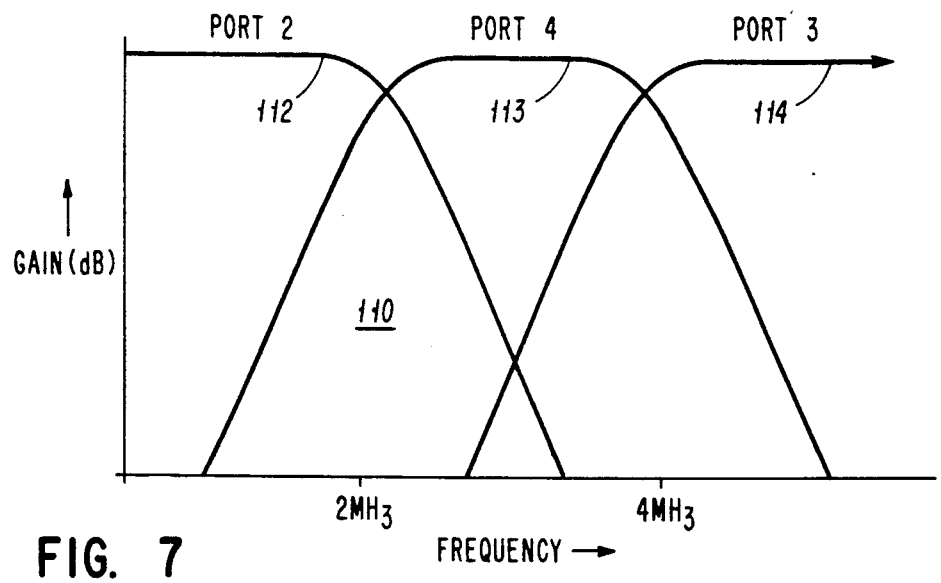
FIG. 7 provides a graph illustrating the performance of the three-split multiplexer shown in FIG. 6.

The graph 110 of FIG. 7 depicts frequency along its abscissa and gain along its ordinate and illustrates the output performance of the diplexer 100. The plots 112, 113 and 114 correspond to the frequency spectra of ports 2, 4 and 3 of the multiplexer 100 and illustrate how port 2 provides a lowpass spectrum cornered at 2 MHz, port 4 provides a passband spectrum cornered at 2 and 4 MHz and port 3 provides a highpass spectrum cornered at 4 MHz.

Figure 8A:
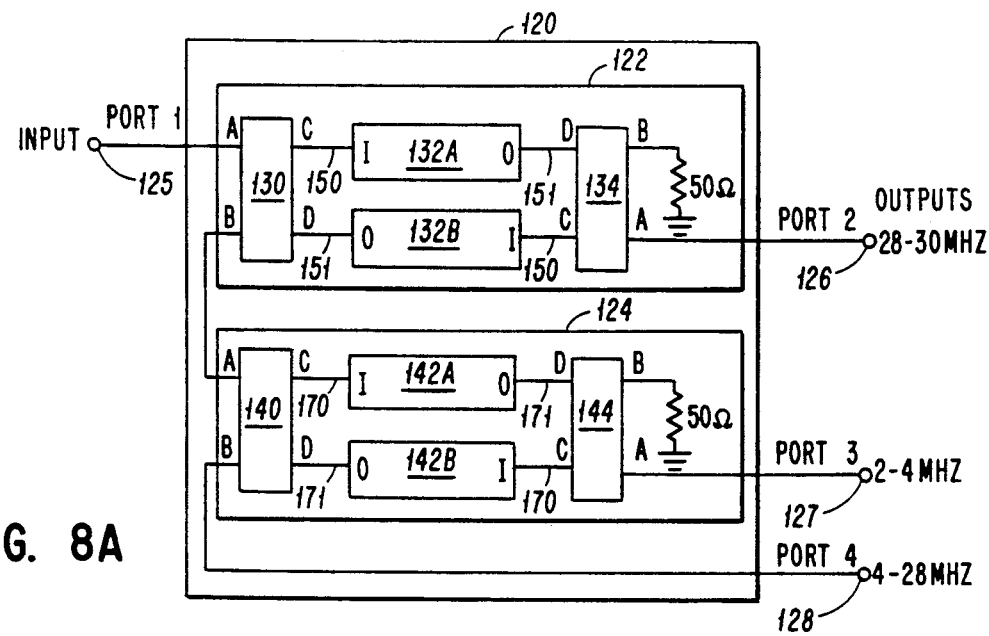
FIG. 8A provides a block diagram of a three-split multiplexer in accordance with the present invention which employs antimetric passband filters and transmission line couplers as splitters and combiners.

Referring now to FIG. 8A, another 3-split multiplexer 120 is shown as including the dual mode diplexers 122 and 124 constructed in accordance with the principles of the present invention. The diplexer 122 includes a 0-degree splitter 130 and a 0-degree combiner 134 between which a pair of antimetric passband filters 132A and 132B are coupled with their input and output terminals 150 and 151 reversed with respect to the directional of signal flow between the splitter and combiner 130 and 134. Likewise, the diplexer 124 includes a 0-degree splitter 140 and a 0-degree combiner 144 between which a pair of antimetric passband filters 142A and 142B are coupled with their input and output terminals 170 and 171 reversed with respect to the direction of signal flow between the splitter and combiner 140 and 144. Otherwise, the interconnections between the splitter, combiner and filter elements of the diplexers 122 and 124 are as explained with respect FIG. 1 and the interconnections between the diplexers 122 and 124 are as explained with respect to FIG. 6.

Input is received at terminal 125 comprising multiplexer port 1 corresponding to port I of diplexer 122 and port A of combiner 130. Output is provided at terminals 126, 127 and 128 comprising multiplexer ports 2, 3 and 4 corresponding to port II of the diplexer 122 and ports II and III of the diplexer 124 and also corresponding to port A of combiner 134, port A of combiner 144 and port B of splitter 140. Port III of the diplexer 122 corresponding to port B of splitter 130 is connected to port I of the diplexer 124 corresponding to port A of the splitter 140.

The splitters 130 and 140 and the combiners 134 and 144 of the diplexers 122 and 124 of the multiplexer 120 comprise T-bridge transmission line directional couplers of the type shown in FIGS. 4A and 4B which are adapted for high frequency operations. The filters 132A and 132B and 142A and 142B of the diplexers 122 and 124 of the multiplexer 120 comprise 4-pole Chebyshev antimetric bandpass filters as illustrated in FIGS. 8B and 8C.

Figure 8B:
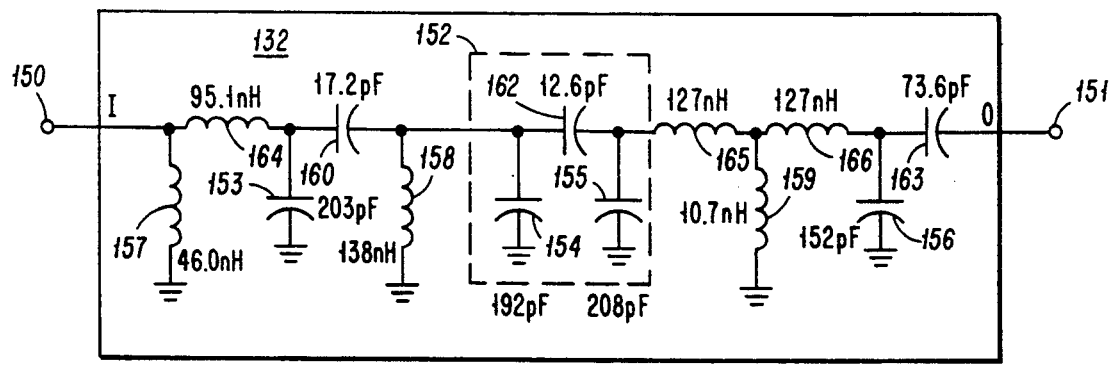
FIGS. 8B and 8C provide schematics of the antimetric passband filters employed in the diplexers of the multiplexer shown in FIG. 8A.

Referring now to FIG. 8B, the filter 132 includes the shunt capacitors 153-156 and the shunt inductors 157-159 together with the series capacitors 160-163 and the series inductors 164-166. The capacitors 154, 155 and 162 comprise a Norton transform 152 of the required coupling between the right and left halves of the filter 132. With the values of the inductors and capacitors shown, the filter 132 comprises a narrowband Chebyshev passband filter having corner frequencies at 27.68 and 30.24 MHz. In accordance with the antimetric properties of the filter 132, input may be provided to either the terminal 150 or 151 with the filter providing the same frequency selectivity but with reflection coefficients which are 180° out-of-phase.

Figure 8C:
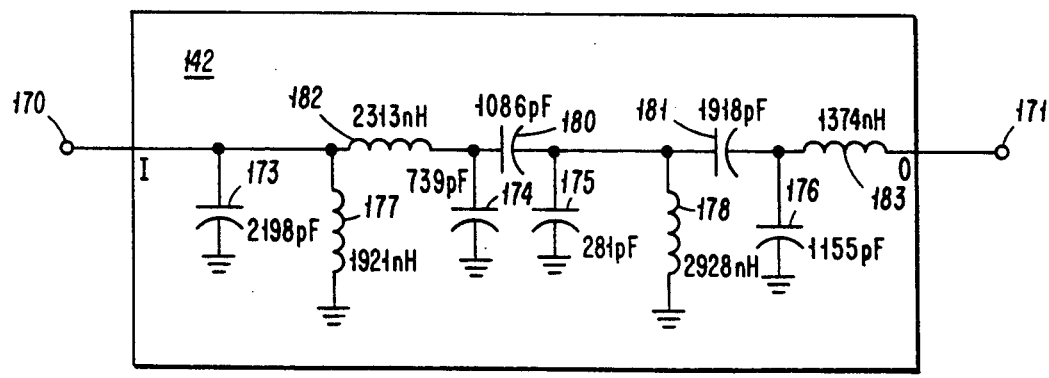

Referring now to FIG. 8C, the filter 142 comprises the shunt capacitors 173-176 and the shunt inductors 177-178 together with the series capacitors 180-181 and series inductors 182-183. The capacitors 174, 175 and 180 comprise a Norton transform 172 of the elements required for coupling the right and left halves of the filter 142. With the values of the inductors and capacitors shown, the filter 142 comprises a Chebyshev passband filter having corner frequencies at 2 MHz and 4 MHz. In accordance with the antimetric properties of the filter 142, input may be provided either to the terminal 170 or 171 with the filter providing the same frequency selectivity but with reflection coefficients which are 180° out-of-phase.

The multiplexer 122 provides providing passband outputs at its output ports 2, 3 and 4 corresponding to the characteristics of the filters 132 and 142 namely a 28-30 MHz passband at port 2, a 2-4 MHz passband at port 3 and a 4-28 MHz passband at port 4. The multiplexer 120 of FIG. 8A illustrates the use of antimetric passband filters in dual mode diplexers of the present invention for providing frequency selective passband outputs and the use of transmission line couplers in higher frequency applications.

Figure 9A:
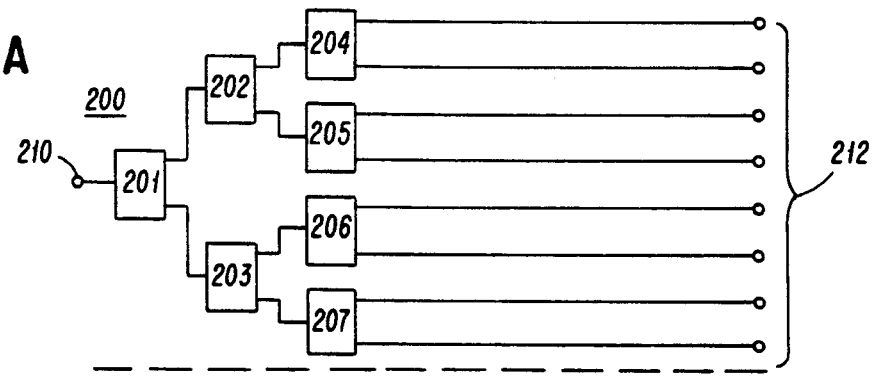
FIG. 9A, B and C provide block diagrams of multiplexer networks constructed by interconnecting dual mode diplexers of the present invention showing the variety of ways in which such diplexers can be utilized in multiplexer networks.
Figure 9B:
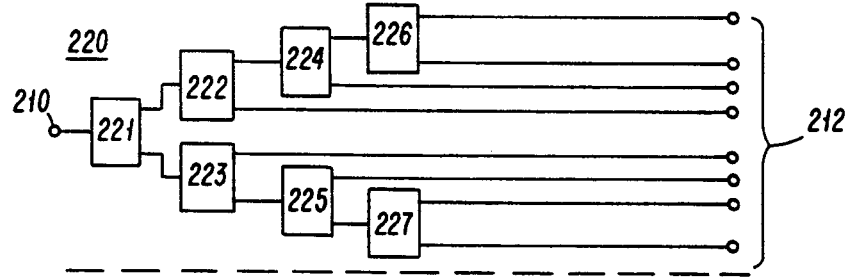
Figure 9C:
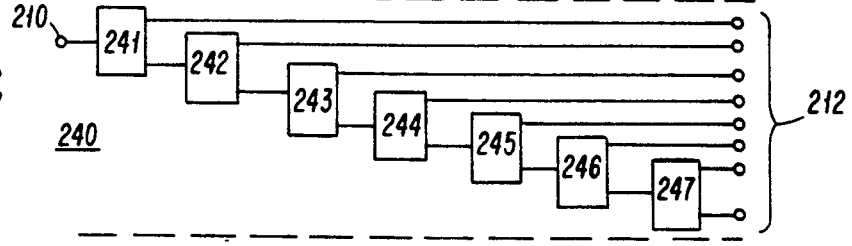

Referring now to FIGS. 9A, B and C the multiplexer networks 200, 220 and 240 include dual mode diplexers 201-207, 221-227 and 241-247. Each of the multiplexer networks 200, 220 and 240 provides a different arrangement of interconnections whereby the diplexers included in these circuits can process a single input signal provided at the terminal 210 and provide an 8-band frequency split at the eight output terminals 212. The multiplexer network 200, 220 and 240 illustrate how the diplexers of the present invention may be interconnected in a variety of ways both in series and in parallel to realize a desired synthesis for obtaining multiple frequency selective outputs. Certain common characteristics may be noted with respect to the networks 200, 220 and 240 which each provide an 8-band split. Each network 200, 220 and 240 includes seven diplexers which is one less (N−1) than the total number of outputs (N) and the networks 200, 220 and 240 feature six interconnections between diplexers which is two less (N−2) than the total number of outputs (N).

While particular embodiments of the present invention have been shown and described, it should be clear that changes and modifications may be made to such embodiments without departing from the true scope and spirit of the invention. It is intended that the appended claims cover all such changes and modifications.

I claim:

1. A broadband diplexer, comprising:
 a 0-degree splitter having an input port connected for receiving diplexer input, first and second output ports and an isolation port connected for providing complimentary output from said diplexer;
 a first filter which is connected to said first output port for receiving output from said splitter;
 a second filter comprising a dual of said first filter which is connected to said second output port for receiving output from said splitter; and
 a 0-degree combiner having first and second input ports connected for receiving input from said first and second filter, an isolation port connected to a dump resistance and an output port connected for providing primary output from said diplexer.

2. The diplexer of claim 1, wherein said first and second filters are antimetric.

3. The diplexer of claim 1, wherein said first and second filters each include a Norton transform of an ideal transformer and capacitors for coupling said filters.

4. The diplexer of claim 1, wherein said splitter and said combiner comprise T-bridge 3 dB transmission line couplers.

5. A multiplexer for splitting the frequency spectrum of an input signal into a plurality N of components, comprising N−1 dual mode diplexers each of which include a filter and a dual of said filter coupled between a 0-degree splitter and a 0-degree combiner and each of which have one input and two outputs, said diplexers interconnected such that N−2 of the outputs of said diplexers are connected to inputs of other diplexers so as to split the frequency spectrum of said input signal into N components.

6. The multiplexer of claim 5, wherein each of said filters and said duals of said filters are antimetric.

7. The multiplexer of claim 5, wherein said splitters and combiners comprise T-bridge 3 dB transmission line couplers.

8. A 3-split multiplexer characterized by broadband performance, comprising:
 a first diplexer;
 a second diplexer;

wherein each diplexer includes a 0-degree splitter, 0-degree combiner and a pair of filters comprising duals of one another which are coupled between said splitter and combiner and having an input port to said splitter, a primary output port from said combiner and a complimentary output port from said splitter;

wherein said input port to said splitter of said first diplexer serves as a first multiplexer input port; and, wherein said input port to said second diplexer is connected to the complimentary output port of aid first diplexer and said primary output port from said combiner and said complimentary output port from said splitter of said second diplexer serving as a second and a third multiplexer output port.

9. The multiplexer of claim 8, wherein said filters and duals of said filters and antimetric.

10. The multiplexer of claim 8, wherein said splitters and combiners comprise T-bridge 3-dB transmission line couplers.

11. The diplexer of claim 1, wherein said first and second filters are antimetric narrowband bandpass filters each having an ideal transformer at the center interface of said filter to assure control of the resistance of the terminations at the filter poles are equal.

* * * * *